(12) United States Patent
Coulman et al.

(10) Patent No.: US 6,600,959 B1
(45) Date of Patent: Jul. 29, 2003

(54) METHOD AND APPARATUS FOR IMPLEMENTING MICROPROCESSOR CONTROL LOGIC USING DYNAMIC PROGRAMMABLE LOGIC ARRAYS

(75) Inventors: Paula Kristine Coulman, Austin, TX (US); Sang Hoo Dhong, Austin, TX (US); Brian King Flachs, Georgetown, TX (US); Harm Peter Hofstee, Austin, TX (US); Jaehong Park, Seongnam (KR); Stephen Douglas Posluszny, Round Rock, TX (US); Joel Abraham Silberman, Somers, NY (US); Osamu Takahashi, Round Rock, TX (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/498,934

(22) Filed: Feb. 4, 2000

(51) Int. Cl.$^7$ .................. G05B 19/18; H03K 19/177
(52) U.S. Cl. ................ 700/7; 326/39; 326/41; 326/47
(58) Field of Search .............. 700/1, 7; 712/10, 712/15, 16, 37; 716/16; 326/38, 39, 41, 47

(56) References Cited

U.S. PATENT DOCUMENTS

| | | | |
|---|---|---|---|
| 4,600,995 A | 7/1986 | Kinoshita | 364/491 |
| 4,769,562 A | 9/1988 | Ghisio | 307/469 |
| 5,239,213 A | 8/1993 | Norman et al. | 307/465 |
| 5,283,631 A | 2/1994 | Koerner et al. | 307/451 |
| 5,300,831 A | 4/1994 | Pham et al. | 307/465 |
| 5,331,227 A | 7/1994 | Hawes | 307/465 |
| 5,426,744 A * | 6/1995 | Sawase et al. | 395/375 |
| 5,544,342 A | 8/1996 | Dean | 395/441 |
| 5,553,276 A | 9/1996 | Dean | 395/550 |
| 5,557,768 A | 9/1996 | Braceras et al. | 395/458 |
| 5,689,689 A | 11/1997 | Meyers et al. | 395/553 |
| 5,710,910 A | 1/1998 | Kehl et al. | 395/551 |
| 5,841,296 A | 11/1998 | Churcher et al. | 326/49 |
| 5,872,462 A | 2/1999 | Ditlow et al. | 326/39 |
| 5,959,465 A | 9/1999 | Beat | 326/39 |
| 6,008,666 A | 12/1999 | Conn | 326/39 |
| 6,060,930 A | 5/2000 | Choi | 327/276 |
| 6,070,222 A * | 5/2000 | Farmwald et al. | 711/105 |
| 6,111,428 A | 8/2000 | Hanatani | 326/39 |
| 6,150,863 A | 11/2000 | Conn et al. | 327/270 |
| 6,185,660 B1 | 2/2001 | Mulla et al. | 711/140 |
| 6,202,139 B1 | 3/2001 | Witt et al. | 711/169 |
| 6,226,713 B1 | 5/2001 | Mehrotra | 711/118 |
| 6,229,338 B1 | 5/2001 | Coulman et al. | 326/41 |
| 6,249,859 B1 * | 6/2001 | Boutaud et al. | 712/38 |
| 6,252,792 B1 * | 6/2001 | Marshall et al. | 365/63 |
| 6,263,430 B1 * | 7/2001 | Trimberger et al. | 713/1 |
| 6,266,760 B1 * | 7/2001 | DeHon et al. | 712/15 |
| 6,294,929 B1 | 9/2001 | Coulman et al. | 326/41 |

OTHER PUBLICATIONS

"A 1.0 Ghz Single–Issue 64–Bit PowerPC Integer Processor", Joel Silberman, et al., IEEE Journal of Solid–State Circuits, vol. 33, No. 11. Nov. 1998, IEEE, pp. 1600–1608.
"Designing For A Gigahertz", H. Peter Hofstee, et al., IEEE MICRO, May–Jun. 1998, pp. 66–74.
"Design Methodology for a 1.0 Ghz Microprocessor", S. Posluszny, et al., IEEE 1998, pp. 17–23.

* cited by examiner

*Primary Examiner*—Paul P. Gordon
(74) *Attorney, Agent, or Firm*—Casimer K. Salys; Bracewell & Patterson, L.L.P.

(57) ABSTRACT

A method and apparatus for using dynamic programmable logic arrays in microprocessor control logic provide decreased power and increased clock frequencies for data processing systems, by using programmable logic arrays exclusively for the control logic. The method and apparatus further simplify the design of the control logic and closure of timing within the microprocessor, by providing overlap of control logic evaluations and data transfers within the microprocessor.

20 Claims, 6 Drawing Sheets

METHOD AND APPARATUS FOR IMPLEMENTING MICROPROCESSOR CONTROL LOGIC USING DYNAMIC PROGRAMMABLE LOGIC ARRAYS

CROSS-REFERENCES TO RELATED APPLICATIONS

The present invention is related to the following application filed concurrently with this application:

U.S. patent application Ser. No. 09/498,933 entitled "METHOD AND APPARATUS FOR REDUCING DYNAMIC PROGRAMMABLE LOGIC ARRAY PROPAGATION DELAY" U.S. Pat. No. 6,229,338. The present invention also relates to U.S. patent application Ser. No. 09/443,205 entitled "BALANCED-DELAY PROGRAMMABLE LOGIC ARRAY AND METHOD FOR BALANCING PROGRAMMABLE LOGIC ARRAY DELAYS" filed Dec. 22, 1999, U.S. Pat. No. 6,294,929 having at least one common inventor and assigned to the same assignee. The present invention further relates to U.S. patent application Ser. No. 09/458,405 entitled "PROCESSOR CYCLE TIME INDEPENDENT PIPELINE CACHE AND METHOD FOR PIPELINING DATA FROM A CACHE" filed Dec. 10, 1999, still pending, having at least one common inventor and assigned to the same assignee. The specifications of the above are incorporated herein by reference.

BACKGROUND OF THE INVENTION

1. Field of the Invention

The present invention generally relates to microprocessors, and more particularly to a microprocessor implemented with dynamic logic wherein control logic is implemented in dynamic programmable logic arrays.

2. Description of Related Art

The market for microprocessors is demanding increased processing power, which can be achieved through increased clock frequencies and complexity (for example parallel operation capacity). Increased complexity creates the need for increased circuit density, and use of architectures requiring fewer devices to implement the microprocessor circuits.

One technology that has been applied in recent years to an increasing number of microprocessor and other integrated circuits, is dynamic logic, sometimes referred to as "Domino Logic Circuits". Although these circuits are very efficient from a device per gate standpoint, due to the dynamic nature of the logic (logic signals exist as pulses propagating through a logical network, rather than static stages), design of large scale integrated circuits can become very complex with respect to timing. As clock frequencies increase, timing problems increase, particularly with respect to the interconnection of various functional sub-systems that are displaced from each other within a monolithic circuit. In the past, at low frequencies, focus was placed on local timing issues and blocks could be interconnected easily, as the cycle time of the system was long compared to the propagation delay across the die. With present processor frequencies on the order of 1 gigahertz, the timing constraints on the interconnection within a monolithic circuit becomes significant.

At the heart of a typical microprocessor is the control logic, implemented as "microcode", wherein Read Only Memory (ROM) is used to implement a state sequencer via feedback connections and wherein dataflow elements are coupled to the control logic. The output of the control logic provides the next address that will be issued to access the microcode. ROM is not the most efficient way to implement control logic, as a separate row of hard-wired values is required for each combination of input address lines. The control logic in a microprocessor has to synchronize the operation of various execution units such as load/store units, pre-fetch units, floating point and arithmetic units, and instruction decoding. In order to integrate the operation of all of these functional units within a processor operating at one gigahertz or more, the timing of the signals provided to the control logic and the outputs of the control logic used to create the next machine state must be carefully controlled.

Some modern high clock frequency microprocessors use custom designed logic to perform control logic functions, rather than using a ROM approach. The difficulty in this approach is that the synthesis of the logic will yield timing variations. These logic variations can be cured by insertion of delays, but this may not provide the most optimum performance. The approach is also iterative, which requires adjustments to the entire logic network when the timing of a node on which other logic depends has been changed. In addition, design changes that are made during the development and evolution of a microprocessor require a complete re-evaluation of the timing paths.

The control logic controls data flow, bus operations, and next state sequencing in the microprocessor. Because data from data flow elements must be stabilized at some point in the processor cycle in order to use the data, and next state values must be stabilized at some point in the cycle to reliably sequence the control logic, latches are typically used and timing is typically controlled to prepare and hold this information. This limits processor speed and uses power, since latches use higher power than many other blocks, and the set-up and hold times for the latches constrain the processor speed, as all signals must propagate and remain valid for the set-up and hold time of the latches.

Part of the complexity of timing design is created by increased microprocessor die area. Propagation delays from various parts of the microprocessor have increased, making it difficult to align data flow and control information so that data manipulation and next state sequencing can proceed properly. This is generally the upper limit on clock frequency for a given processor design.

A second part of timing constraints is device skew. With a synthesized control logic design, and data flow components that are not equal in propagation delay, the latching of data and control provides equalization for device skew. This is another effective upper bound on clock frequency. Therefore, it would be desirable to produce an improved control and dataflow logic for a microprocessor such that circuit power and size can be decreased, while providing high frequency operation. It would be further desirable to provide a means for using dynamic logic in a microprocessor such that timing of the interaction of blocks across the die and with varying device skews can be simplified.

SUMMARY OF THE INVENTION

The above objectives are achieved in a microprocessor having control logic block implemented solely in programmable logic arrays. The microprocessor has a plurality of processing blocks for performing pipelined operations, a control logic means made solely from programmable logic arrays for operating each of the processing blocks by decoding a last state, and pulse stretching means coupled to the outputs of the programmable logic arrays for synchronizing the outputs.

The microprocessor may further include a multiplexer latch coupled to the inputs of the dynamic programmable logic arrays, so that the control logic outputs can be combined with data and comparison results.

The processor may also include a dataflow block for providing operand data, and a multiplexer latch is coupled to said dataflow block for providing operand data as an input to the programmable logic arrays. The processor may further include a comparator block for comparing operand data and immediate values.

The programmable logic arrays may use dummy devices to balance the loading of the input plane, and may have a sub-divided output plane for decreasing propagation delay.

The pulse stretching means may include preset means for generating a preset strobe from one edge of a system clock and means for stretching outputs until the assertion of the preset clock so that a change in state computed at any time during a cycle of the preset clock until the assertion of said preset strobe can be provided to an output.

The invention also includes a method for implementing a microprocessor including the steps of determining a high-level description of a logic network required to decode and execute operands, synthesizing the logic network in programmable logic array form, and fabricating the microprocessor using at least one programmable logic array as the sole implementation of said logic network.

The method may further determine that an output plane of a programmable logic array has a propagation delay that is greater than the sum of propagation delay of an output combining means plus the propagation delay of a divided programmable logic array output plane and responsive to the determination, dividing the output plane into partial result conductors, and coupling the partial result conductors using an output combining means.

The method may also determine that at least one given programmable logic array input signal line has a greater number of attached contribution devices attached than the number of contribution devices attached to another of the array input signal lines, and connecting at least one additional device as a loading device to least one other array input signal line having a lesser number of attached contribution devices.

The above as well as additional objectives, features, and advantages of the present invention will become apparent in the following detailed written description.

BRIEF DESCRIPTION OF THE DRAWINGS

The novel features believed characteristic of the invention are set forth in the appended claims. The invention itself, however, as well as a preferred mode of use, further objectives, and advantages thereof, will best be understood by reference to the following detailed description of an illustrative embodiment when read in conjunction with the accompanying drawings, wherein like numbers correspond to like elements and further:

DETAILED DESCRIPTION OF ILLUSTRATIVE EMBODIMENT

The use of a dynamic programmable logic array (PLA) to entirely implement control logic in a microprocessor has been limited in the past. Timing skew of PLA inputs, combined with a logic depth of at least three gates (an input plane, an output plane and an intermediate strobed stage to stabilize the logical result), have restricted the use of PLAs in high speed microprocessors.

Using the balancing techniques disclosed in BALANCED-DELAY PROGRAMMABLE LOGIC ARRAY AND METHOD FOR BALANCING PROGRAMMABLE LOGIC ARRAY DELAYS, incorporated by reference above, along with the partitioning techniques disclosed in "METHOD AND APPARATUS FOR REDUCING DYNAMIC PROGRAMMABLE LOGIC ARRAY PROPAGATION DELAY", also incorporated by reference above, provide a faster PLA that is suitable for use in the primary control logic path of the microprocessor. In addition, the incorporation of pulse stretching circuits on the outputs of the PLA make it possible for the PLA to combine inputs that have wiring delays due to integration of signals from various areas of the die, while maintaining timing closure at the end of a global system clock cycle. As a result, the area required for the control logic is reduced over ROM implementations, since the ROM requires storage for every possible input state. As an alternative to synthesized logic designs, the PLA provides a more stable timing approach, since the each combinatorial input path will pass through the same number of dynamic logic stages, obviating the need for the iterative timing adjustments required by a synthesized approach.

Figure 1:
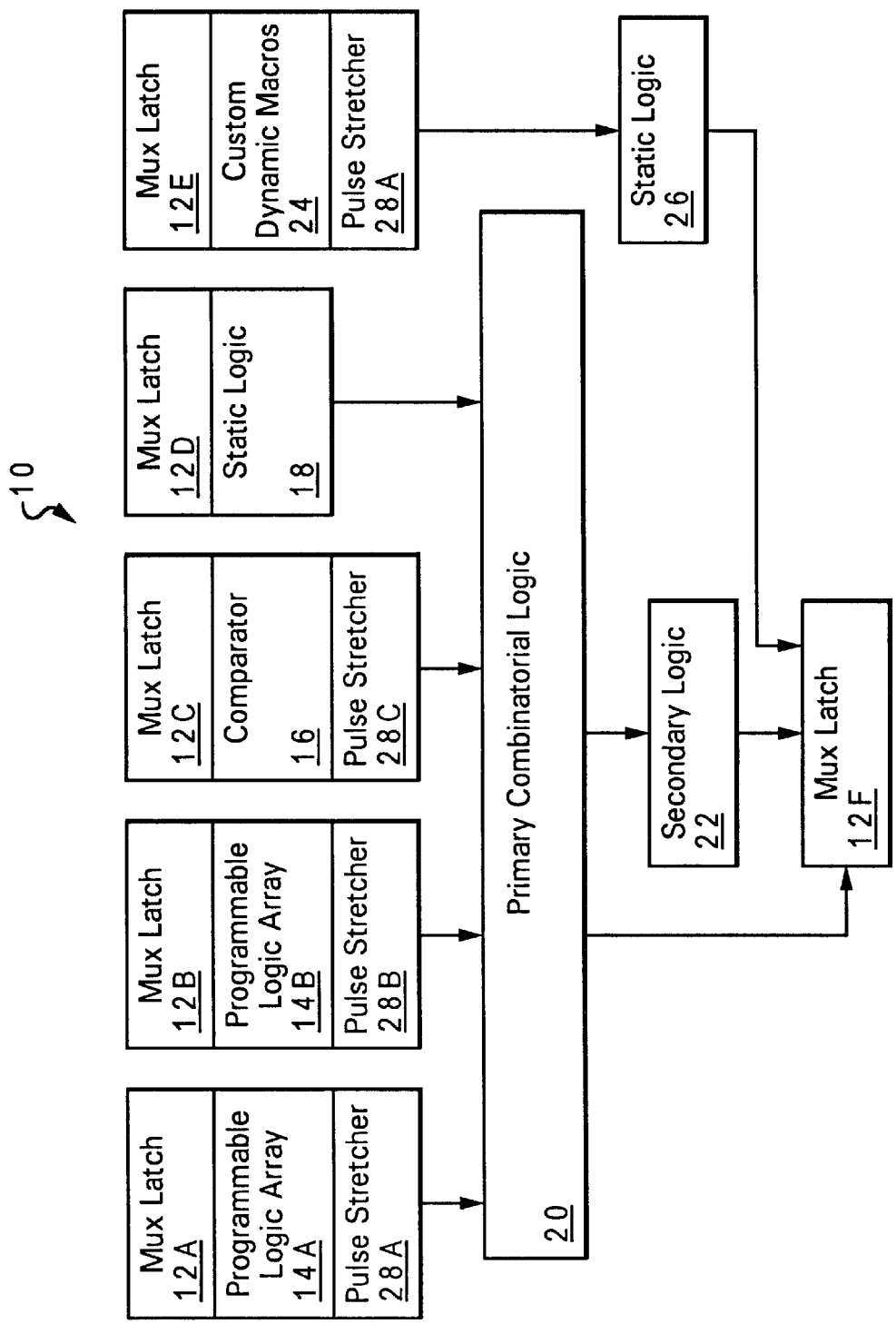
FIG. 1 is a block diagram of a processing block within a microprocessor in accordance with a preferred embodiment of the invention.

A common control logic template can be used within a microprocessor to implement all of the processing blocks such as prefetch units, load/store units, instruction fetch units, and execution units. Referring to FIG. 1, processing block 10 of the present invention is depicted in block diagram form. Primary combinatorial logic 20, combines the outputs of the control logic PLAs 14A and 14B. PLAs 14A and 14B decode operands for the control logic, comparator 16, provides results of operand comparisons, and static logic 18 provides stored values from register files or arithmetic results from hard-wired logic. The outputs of PLAs 14A and 14B are adapted by pulse stretchers 28A and 28B and supplied to primary combinatorial logic 20. Unique to this architecture, the decoding of operands in this block is performed by the PLAs exclusively, with no ROM or synthesized logic used in the operand decode logic. Primary combinatorial logic produces an early result allowing selection of a dataflow output from static logic 26 or an output of secondary logic 22, in order to sequence the next state of processing block 10. Mux latches 12A through 12E are 8-way multiplexers, allowing for input selection between the output of mux latch 12F, load/store data, immediate instruction values, and other internal results. The integration of the multiplexer with a latch, provides a low delay at the input of PLAs 14A–14B, as well as comparator 16, and static logic 18, making it possible for the next state to propagate from mux latch 12F back to input mux latches 12A–12E and through the entire circuit back to the input mux latch 12F within a processor cycle boundary.

Figure 2:
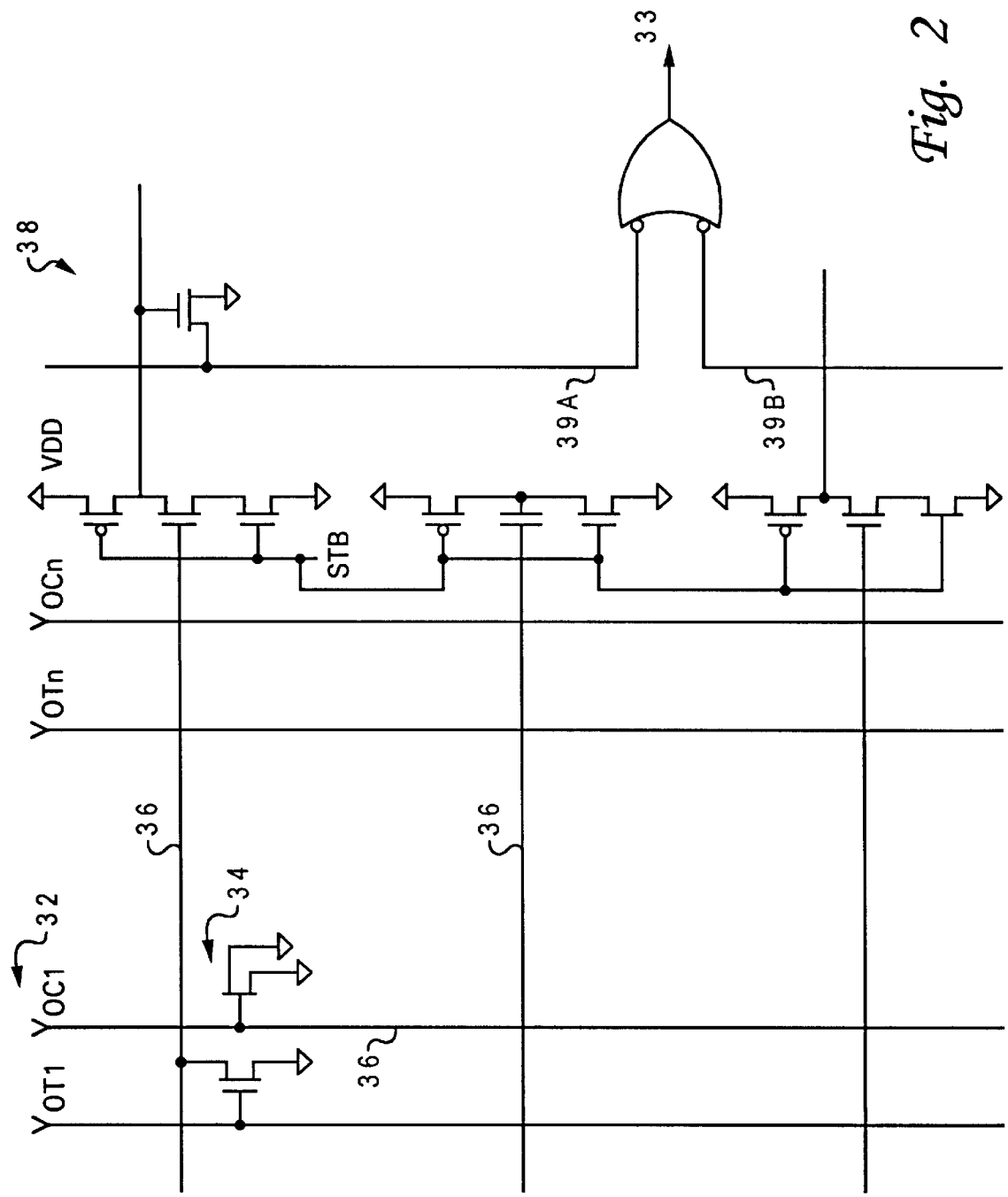
FIG. 2 is a schematic diagram of a programmable logic array for implementing the control logic within the processing block of FIG. 1, in accordance with a preferred embodiment of the invention.

Referring now to FIG. 2, a PLA suitable for use in processing block 10 is shown. Logic inputs 32, are provided in complementary pairs by mux latches 12A–12B. The inputs 32 are balanced using dummy cells 34 to provide equal loading on all of the gate input lines 36, ensuring that wire and device capacitive delays are equal, minimizing device skew. The output OR plane 38 is fed by single ended inputs, and the plane is partitioned by combining portions of the OR plane to provide partial results 39A and 39B, and then combining these partial results to form the final OR output 33. This reduces the wire capacitance in the OR plane, creating a lower propagation delay than a PLA designed with a single undivided OR plane.

Figure 3:
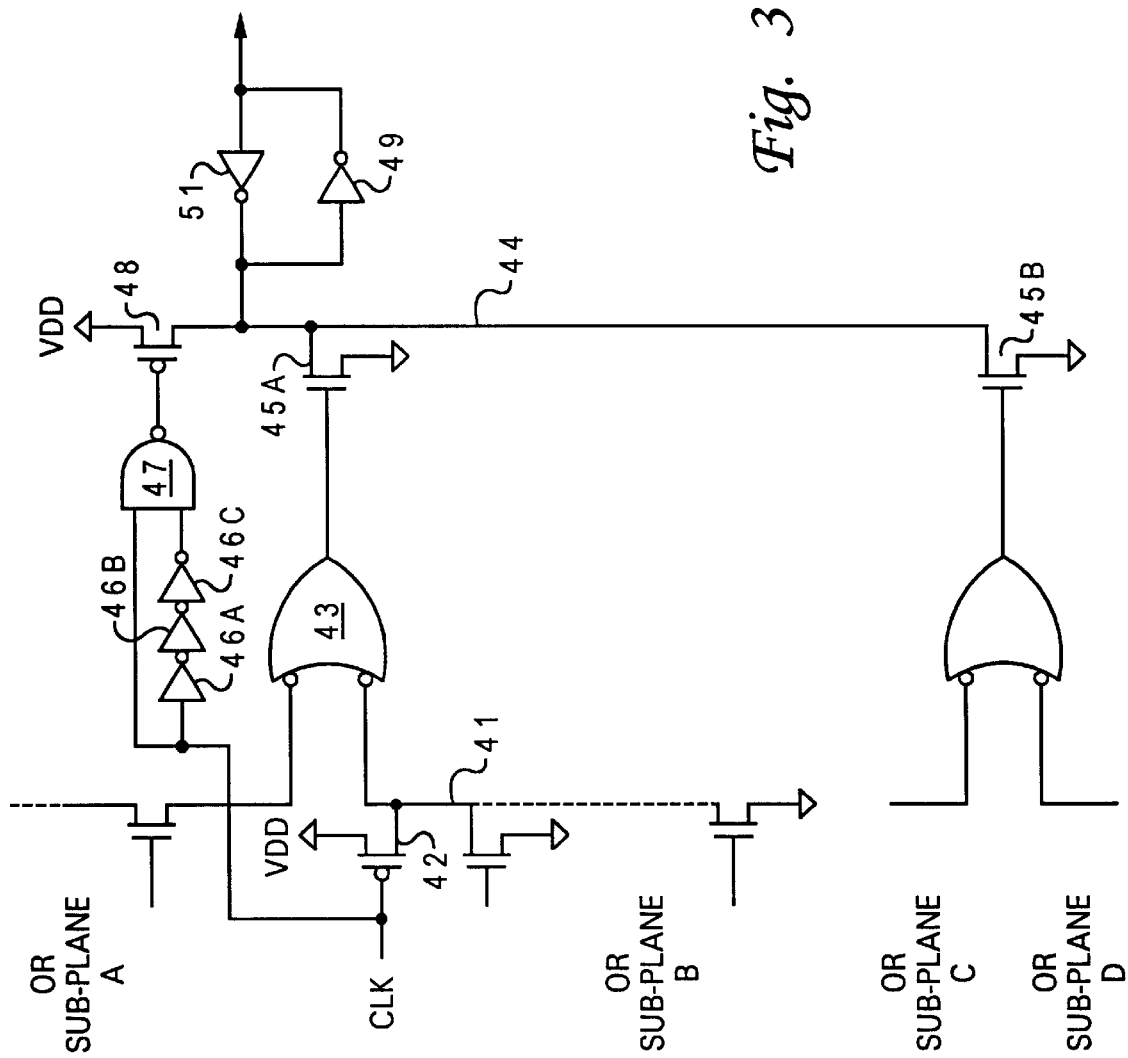
FIG. 3 is a schematic diagram of a pulse stretcher integrated with the output of the programmable logic array from FIG. 2.

Referring now to FIG. 3, the integration of pulse stretchers 28A–28B, within PLAs 14A–14B is shown. OR sub-plane 41 is pre-set by CLK via P-channel device 42. NAND gate 43 combines a pair of adjacent sub-planes to produce an OR output. The sub-plane pairs are combined on global NOR line 44, by N-channel devices 45A and 45B. Inverters 46A–C delay the CLK signal. NAND gate 47, combines the delayed clock with CLK to produce a pulse that presets the global NOR of the PLA by turning on P-channel device 48, and inverter 49, inverts the NOR output to produce an OR result. Inverter 51 holds the value at NOR output in a steady state, stretching the pulse produced by NOR output, until the next preset cycle.

Figure 4:
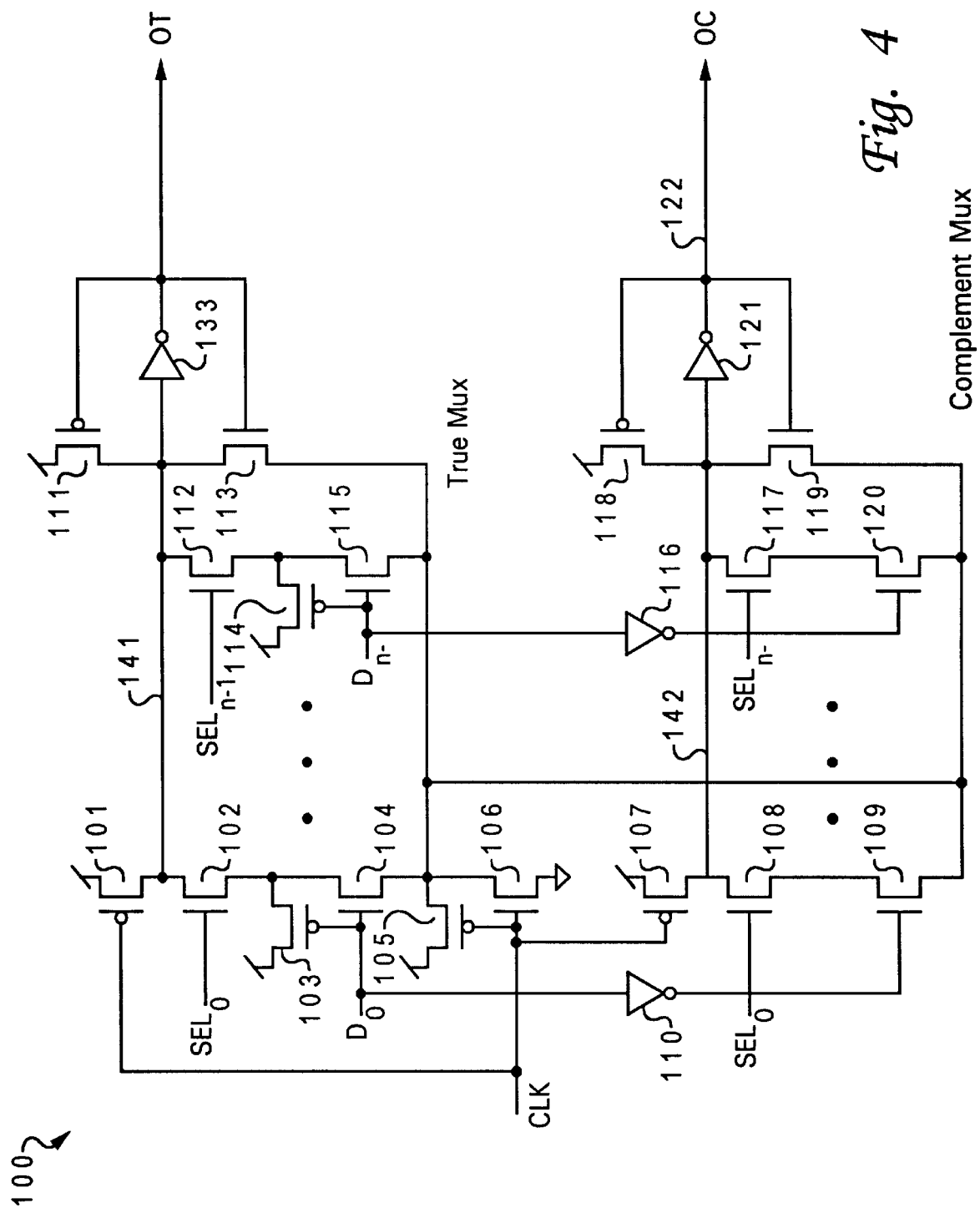
FIG. 4 is a schematic diagram of a multiplexer/latch within the processing block of FIG. 1.

Referring now to FIG. 4, a mux latch 100 in accordance with a preferred embodiment of the present invention is shown. Integrating the multiplexers that select the control logic inputs with a latch that holds the values stable after the control logic inputs have been set provides a lower propagation delay than an isolated multiplexer coupled to a latch. In addition, mux latch 100, provides the complementary outputs that are needed by the AND plane of PLAs 14A and 14B.

SEL0 is a select input that enables N-channel device 102 and 108, to connect data input D0 to a true common node 141 and a complement common node 142. CLK is the preset input to clock the data into the dynamic input stage. When CLK is in a low logic state, P-channel devices 101 and 107 preset nodes 141 and 142, respectively. When CLK is in a high logic state, N-channel device 106 is enabled, allowing N-channel device 104 to discharge node 141 if data input D0 is in a high logic state or enabling N-channel device 109 to discharge node 142 if D0 is in a low logic state. Inverter 110 provides the needed logic inversion to turn on N-channel device 109 when D0 is in a low logic state. Devices 103 and 105 provide noise immunity with respect to clock and data inputs CLK and D0.

Common nodes 141 and 142 can have a plurality of circuits connected, one for each data input provided to the multiplexer. Data input Dn enables N-channel device 115 or N-channel device 120 by action of inverter 116 in a similar fashion as described above for input D0. Devices 112 and 117 provide selection of the Dn input when SELn is at a logic high value. Device 114 provides noise immunity on the Dn input.

Inverter 133 provides a latching function to the mux latch. While common node 141 is in a high (preset) state, device 111 will be on, holding the value at common node 141. If node 141 is preset to a low value by the operation of one of the mux input circuits, then device 113 will hold common node 141 low until it is preset again by CLK turning on device 101. (CLK deactivates device 106, preventing device 113 from clamping common node 114 during the preset portion of the clock cycle.) The complement output circuit comprising inverter 121, P-channel device 118 and N-channel device 119, works in a similar fashion. Device 118 provides clamping of the preset voltage unless devices 117 and 120 set common complement node 142 causing inverter 121 to turn off device 118 and turn on device 117.

Figure 5:
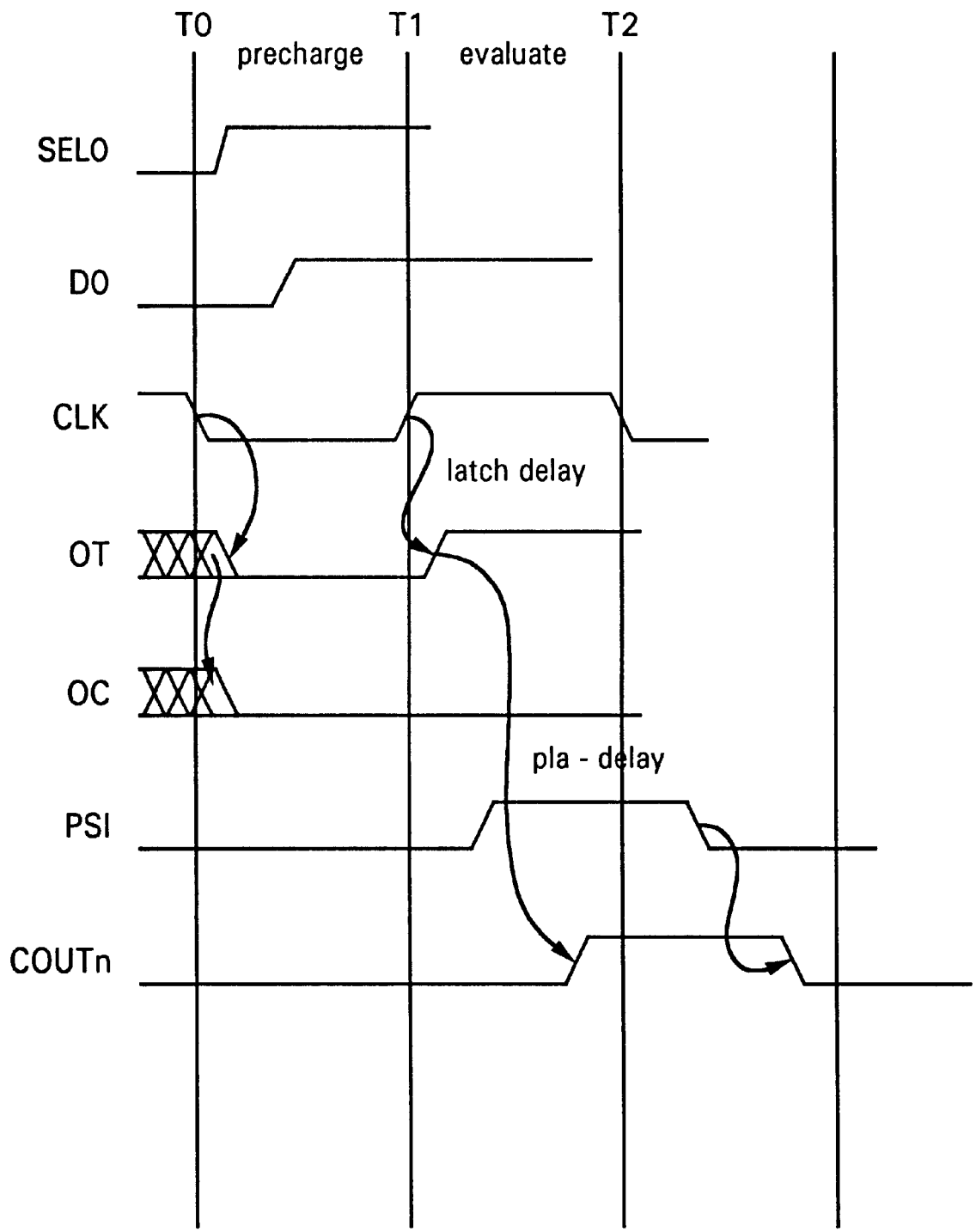
FIG. 5 is a timing diagram of signals within the processing block of FIG. 1, in accordance with the operation of the preferred embodiment of the invention.

Referring now to FIG. 5, the overall timing of the control logic of the present invention is depicted. At time T0, the first logic clock in the chain CLK, clocks the mux latches, presetting them. When CLK is de-asserted at T1, the input D0 and its complement are reflected in the outputs OC and TO. The one-shot of pulse stretchers 28A and 28B produce PS1, which clocks the output stage of PLA's 14A and 14B to produce control outputs COUTn. The arrows depicted in FIG. 5 show the edge relationships between COUTn and the input signals. The leading edge of COUTn is set by the data TO and is valid at time T1. COUTn is held until time T2, since it will not be set or reset until the next PS1 one-shot pulse is produced. The final outputs produced by primary logic 20 and secondary logic 22 arrive at mux latch 12F at the end of the cycle, allowing the next state to be clocked from the output of 12F.

Figure 6:
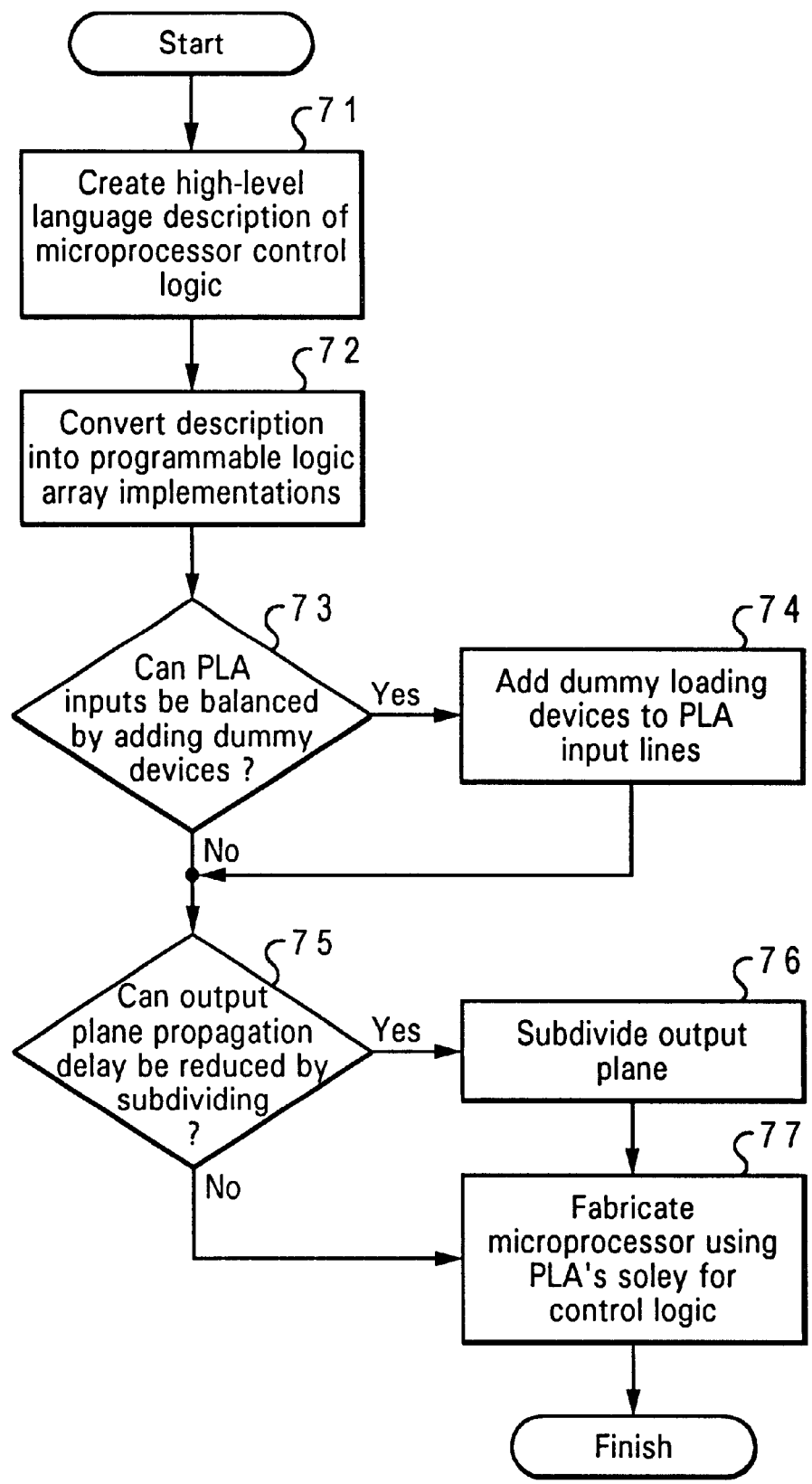
FIG. 6 is a flow diagram of a method for implementing a microprocessor using processing blocks in accordance with a preferred embodiment of the invention.

Referring now to FIG. 6, a method in accordance with a preferred embodiment of the invention is depicted in flow diagram form. A high-level language of the microprocessor control logic is created in a language such as Very High Level Description Language (VHDL) (Step 71). Then, the description is converted into programmable logic array implementations (Step 72). If the PLA inputs are unbalanced (Decision 73), they can be balanced using dummy devices on the input lines (Step 74). If the propagation delay of the PLA outputs can be improved by sub-dividing (Decision 75), they can be sub-divided (Step 76). Then, the microprocessor is fabricated using solely PLA's for the control logic (Step 77).

Although the invention has been described with reference to specific embodiments, this description should not be construed in a limiting sense. Various modifications of the disclosed embodiments, as well as alternative embodiments of the invention, will become apparent to persons skilled in the art upon reference to the description of the invention. For example, the techniques of the present invention could be adapted to cache memory controllers or other devices where data must be synchronized with other devices. It is therefore contemplated that such modifications can be made without departing from the spirit or scope of the present invention as defined in the appended claims.

What is claimed is:

1. A microprocessor comprising:
   a plurality of processing blocks for performing pipelined operations;
   control logic means for operating each of said processing blocks by decoding a last state, wherein said control logic means consisting of at least one dynamic programmable logic array having a plurality of outputs; and
   pulse stretching means, coupled to said at least one dynamic programmable logic array for holding said plurality of outputs until an end of a clock cycle.

2. The processor of claim 1, further comprising at least one integrated multiplexer latch coupled to an input of said dynamic programmable logic array, for holding a result of said plurality of outputs at the inputs of said programmable logic array, so that plurality of outputs can be combined with data and comparison results.

3. The processor of claim 2, further comprising a dataflow block for providing operand data, and said at least one multiplexer latch is coupled to said dataflow block for providing operand data as an input to said at least one programmable logic array.

4. The processor of claim 2, further comprising a comparator block for comparing operand data and immediate values, and said at least one multiplexer latch is coupled to said comparator for providing operand data and immediate values as inputs to said at least one programmable logic array.

5. The processor of claim 1, wherein said at least one programmable logic array comprises:
   a plurality of inputs;
   a plurality of logic gates having a plurality of logic gate inputs; and
   a plurality of devices for coupling said inputs to said logic gate inputs and for loading said logic gate inputs, at least one of said devices coupling at least one of said logic gate inputs to at least one of said inputs when said at least one input forms part of a logic equation associated with said at least one logic gate input, at least one other device loading another input without coupling to any of said logic gate inputs to make the loading of each of said inputs equal.

6. The processor of claim 1, wherein said at least one programmable logic array comprises:
   an input logic plane for producing an intermediate logical result;
   an output logic plane, coupled to said input logic plane, wherein said output logic plane is divided into a plurality of sub-planes for producing a plurality of partial result outputs; and
   an output circuit for combining said partial result outputs to produce a global output of said programmable logic array, so that the propagation delay of said sub-planes combined with the propagation delay of said output circuit is less than the propagation delay of an undivided output logic plane.

7. The processor of claim 6, wherein said input logic plane comprises:
   a plurality of inputs;
   a plurality of logic gates having a plurality of logic gate inputs; and
   a plurality of devices for coupling said inputs to said logic gate inputs and for loading said logic gate inputs, at least one of said devices coupling at least one of said logic gate inputs to at least one of said inputs when said at least one input forms part of a logic equation associated with said at least one logic gate input, at least one other device loading another input without coupling to any of said logic gate inputs to make the loading of each of said inputs equal.

8. The processor of claim 1, further comprising primary combinatorial logic means coupled to said at least one programmable logic array, and said primary logic means has at least one output for selecting one of an output from a second combinatorial logic means logic array or a dataflow block output.

9. The processor of claim 1, wherein said pulse stretching means comprises:
   preset means for generating a preset strobe from one edge of a system clock provided to said at least one dynamic programmable array logic; and
   means for stretching said outputs of said at least one dynamic programmable logic array until an assertion of said preset clock so that a change in state computed at any time during a cycle of said preset clock until said assertion of said preset strobe can be provided to an output of said programmable logic array.

10. A microprocessor comprising:
    a plurality of processing blocks for performing pipelined operations;
    control logic means for operating each of said processing blocks by decoding a last state, wherein said control logic means consisting of at least one dynamic programmable logic array comprising
        an input logic plane for producing an intermediate logical result comprising
            a plurality of inputs;
            a plurality of logic gates having a plurality of logic gate inputs;
            a plurality of devices for coupling said inputs to said logic gate inputs and for loading said logic gate inputs, at least one of said devices coupling at least one of said logic gate inputs to at least one of said inputs when said at least one input forms part of a logic equation associated with said at least one logic gate input, at least one other device loading another input without coupling to any of said logic gate inputs to make the loading of each of said inputs equal;
        an output logic plane, coupled to said input logic plane, wherein said output logic plane is divided into a plurality of sub-planes for producing a plurality of partial result outputs;
        an output circuit for combining said partial result outputs to produce a global output of said programmable logic array, so that the propagation delay of said sub-planes combined with a propagation delay of said output circuit is less than a propagation delay of an undivided output logic plane;
    pulse stretching means, coupled to a plurality of outputs of said at least one dynamic programmable array logic for synchronizing a plurality of outputs of said dynamic programmable array logic, said pulse stretching means comprising
        preset means for generating a preset strobe from one edge of a system clock provided to said at least one dynamic programmable array logic; and
        means for stretching said outputs of said at least one dynamic programmable logic array until an assertion of said preset clock so that a change in state computed at any time during a cycle of said preset clock until said assertion of said preset strobe can be provided to an output of said programmable logic array.

11. The processor of claim 10, further comprising at least one integrated multiplexer latch coupled to an input of said dynamic programmable logic array, for holding said plurality of outputs, so that plurality of outputs can be combined with data.

12. The processor of claim 11, further comprising a dataflow block for providing operand data, and said at least one multiplexer latch is coupled to said dataflow block for providing operand data as an input to said at least one programmable logic array.

13. The processor of claim 12, further comprising a comparator block for comparing operand data and immediate values, and said at least one multiplexer latch is coupled to said comparator for providing operand data and immediate values as inputs to said at least one programmable logic array.

14. A method for implementing a microprocessor comprising the steps of:
    determining a high-level description of a logic network required to decode and execute operands;

synthesizing said logic in programmable logic array form; and fabricating said microprocessor using only at least one programmable logic array as the sole implementation of said logic network.

15. The method of claim 14, further comprising the steps of:

determining that an output plane of said at least one programmable logic array has a propagation delay that is greater than a sum of propagation delay of an output combining means plus a propagation delay of a divided programmable logic array output plane;

responsive to said determining step, dividing said output plane into partial result conductors; and coupling said partial result conductors using an output combining means.

16. The method of claim 15, wherein said sub-planes each have an associated summing node and said output combining means comprises an NAND circuit for combining the outputs of said sub-planes, wherein conductors for said summing nodes are located in a first physical track, said summing node conductors are disposed end-to-end along said first physical track, said output combining means combines said summing nodes by coupling said summing nodes through a plurality of N-channel devices, one associated with each summing node, and said associated N-channel device is located adjacent to each of said summing node conductors, and said combining step comprises activating said N-channel devices to discharge said global output.

17. The method of claim 16, further comprising the steps of:

determining that at least one given programmable logic array input signal line has a greater number of attached contribution devices attached than the number of contribution devices attached to another of said array input signal lines; and connecting at least one additional device as a loading device, responsive to said determining step, to least one other array input signal line having a lesser number of attached contribution devices.

18. The method of claim 17 wherein said step of connecting comprises connecting a gate of at least one transistor to a another array input signal line, and all channel terminals of said at least one transistor are coupled to ground.

19. The method of claim 14, further comprising the steps of:

determining that at least one given programmable logic array input signal line has a greater number of attached contribution devices attached than a number of contribution devices attached to another of said array input signal lines; and connecting at least one additional device as a loading device, responsive to said determining step, to least one other array input signal line having a lesser number of attached contribution devices.

20. The method of claim 19 wherein said step of connecting comprises connecting a gate of at least one transistor to a another array input signal line, and all channel terminals of said at least one transistor are coupled to ground.

* * * * *